United States Patent
Kazuno

(10) Patent No.: US 9,227,296 B2
(45) Date of Patent: Jan. 5, 2016

(54) POLISHING PAD

(71) Applicant: TOYO TIRE & RUBBER CO., LTD., Osaka-shi, Osaka (JP)

(72) Inventor: Atsushi Kazuno, Osaka (JP)

(73) Assignee: TOYO TIRE & RUBBER CO., LTD., Osaka (JP)

(*) Notice: Subject to any disclaimer, the term of this patent is extended or adjusted under 35 U.S.C. 154(b) by 17 days.

(21) Appl. No.: 14/367,743

(22) PCT Filed: Dec. 6, 2012

(86) PCT No.: PCT/JP2012/081692
§ 371 (c)(1),
(2) Date: Jun. 20, 2014

(87) PCT Pub. No.: WO2013/099556
PCT Pub. Date: Jul. 4, 2013

(65) Prior Publication Data
US 2014/0378032 A1    Dec. 25, 2014

(30) Foreign Application Priority Data
Dec. 28, 2011    (JP) ................... 2011-288599

(51) Int. Cl.
*B24D 11/00*    (2006.01)
*B24B 37/22*    (2012.01)
(Continued)

(52) U.S. Cl.
CPC ............ *B24B 37/22* (2013.01); *B24D 18/0072* (2013.01); *H01L 21/304* (2013.01)

(58) Field of Classification Search
CPC ........ B24B 37/22; B24B 37/24; B24B 27/26; B24D 11/00; B24D 15/04; B24D 18/00; B24D 11/005; B24D 3/344; B24D 3/28; B23B 37/1207; B23B 38/0004; B23B 2037/1215
USPC ..................... 451/533, 538; 51/297
See application file for complete search history.

(56) References Cited

U.S. PATENT DOCUMENTS 4,581,287 A * 4/1986 Smith ..................... A47L 13/16
                                                          15/209.1
5,607,982 A * 3/1997 Heyman ................. C08G 18/48
                                                          264/215
(Continued)

FOREIGN PATENT DOCUMENTS

JP    2000-117619 A    4/2000

OTHER PUBLICATIONS
International Search Report (ISR) mailed Jan. 8, 2013, issued for international application No. PCT/JP2012/081692.
(Continued)

*Primary Examiner* — George Nguyen
(74) *Attorney, Agent, or Firm* — Law Office of Katsuhiro Arai

(57) ABSTRACT

The purpose of the present invention is to provide a laminated polishing pad that can be flatly bonded to a polishing platen even if it is large in size. This laminated polishing pad, comprising a polishing layer and a support layer with an adhesive member interposed therebetween, wherein the polishing layer contains 0.5 to 5% by weight of a hydrophilic substance; the support layer is a layer obtained by integrally molding a cushion layer and a resin film having a thermal dimensional change rate of 1.3 to 12.6%; the laminated polishing pad has a concavely warped form in the polishing layer side; and the laminated polishing pad has an average warp amount of 3 to 50 mm at the peripheral edge of the pad.

7 Claims, 2 Drawing Sheets

(51) Int. Cl.
*B24D 18/00* (2006.01)
*H01L 21/304* (2006.01)

(56) References Cited

U.S. PATENT DOCUMENTS

| | | | | |
|---|---|---|---|---|
| 6,803,495 B2* | 10/2004 | Simpson | ......... | A61L 15/26 521/50 |
| 7,762,870 B2* | 7/2010 | Ono | ......... | B24B 37/22 451/28 |
| 8,167,690 B2* | 5/2012 | Fukuda | ......... | B24B 37/24 451/528 |
| 8,257,153 B2* | 9/2012 | Fukuda | ......... | B24B 37/24 451/527 |
| 8,318,298 B2* | 11/2012 | Hirose | ......... | B29C 44/06 428/314.2 |
| 8,409,308 B2* | 4/2013 | Sato | ......... | B24B 37/205 156/108 |
| 8,476,328 B2* | 7/2013 | Hirose | ......... | B24B 37/24 428/131 |
| 8,557,376 B2* | 10/2013 | Matsumura | ......... | B24B 37/22 428/316.6 |
| 2004/0142641 A1* | 7/2004 | Ohno | ......... | B24B 3/24 451/141 |
| 2005/0064709 A1* | 3/2005 | Shimomura | ......... | B24B 37/24 438/689 |
| 2005/0112354 A1* | 5/2005 | Kume | ......... | B24D 3/32 428/304.4 |
| 2006/0022368 A1* | 2/2006 | Lee | ......... | B24B 37/24 264/51 |
| 2009/0011221 A1* | 1/2009 | Kawaguchi | ......... | B24B 37/24 428/319.3 |
| 2009/0093202 A1* | 4/2009 | Fukuda | ......... | B24B 37/22 451/533 |

OTHER PUBLICATIONS

Notification of Transmittal of Translation of the International Preliminary Report on Patentability (PCT/IB/338) mailed Jul. 10, 2014, with International Preliminary Report on Patentability (PCT/IB/373) and Written Opinion of the International Searching Authority (PCT/ISA/237), for corresponding international application PCT/JP2012/081692.

* cited by examiner

POLISHING PAD

This application is the U.S. National Phase under 35 U.S.C. §371 of International Application PCT/JP2012/081692, filed Dec. 6, 2012, which claims priorities to Japanese Patent Applications No. 2011-288599, filed Dec. 28, 2011. The International Application was published under PCT Article 21(2) in a language other than English.

TECHNICAL FIELD

The present invention relates to a laminated polishing pad by which the planarizing processing of optical materials such as lenses, reflecting mirrors and the like, silicon wafers, glass substrates for hard disks, aluminum substrates, and materials requiring a high degree of surface planarity such as those in general metal polishing processing can be carried out stably with high polishing efficiency. The laminated polishing pad of the present invention is used particularly preferably in a process of planarizing a silicon wafer, and a device having an oxide layer, a metal layer or the like formed on a silicon wafer, before lamination and formation of the oxide layer, the metal layer or the like.

BACKGROUND ART

Production of a semiconductor device involves a step of forming an electroconductive film on the surface of a wafer to form a wiring layer by photolithography, etching etc., a step of forming an interlaminar insulating film on the wiring layer, etc., and an uneven surface made of an electroconductive material such as metal and an insulating material is generated on the surface of a wafer by these steps. In recent years, processing for fine wiring and multilayer wiring is advancing for the purpose of higher integration of semiconductor integrated circuits, and accordingly techniques of planarizing an uneven surface of a wafer have become important.

As the method of planarizing an uneven surface of a wafer, a CMP method is generally used. CMP is a technique wherein while the surface of a wafer to be polished is pressed against a polishing surface of a polishing pad, the surface of the wafer is polished with slurry having abrasive grains dispersed therein. As shown in FIG. 1, a polishing apparatus used generally in CMP is provided for example with a polishing platen 2 for supporting a polishing pad 1, a supporting stand (polishing head) 5 for supporting a polished material (wafer) 4, a backing material for uniformly pressurizing a wafer, and a mechanism of feeding an abrasive. The polishing pad 1 is fitted with the polishing platen 2 for example via a double-sided tape. The polishing platen 2 and the supporting stand 5 are provided with rotating shafts 6 and 7 respectively and are arranged such that the polishing pad 1 and the polished material 4, both of which are supported by them, are opposed to each other. The supporting stand 5 is provided with a pressurizing mechanism for pushing the polished material 4 against the polishing pad 1.

Patent Document 1 proposes a method for polishing a semiconductor substrate, comprising fixing a semiconductor substrate to a polishing head; pushing a polishing layer having a micro-rubber A hardness of 70 degrees or more, which is fixed to a polishing platen with a cushion layer interposed therebetween having a volume modulus of 600 kg/cm$^2$ or more and a compression elastic modulus of 10 kg/cm$^2$ or more and 140 kg/cm$^2$ or less, against the semiconductor substrate; and rotating the polishing head or the polishing platen or both of them in the state where the warps or irregularities of the semiconductor substrate itself are absorbed into the cushion layer, so that the semiconductor substrate is polished.

Recently, a polishing pad has also been increased in size with upsizing of semiconductor wafers, and thus work of bonding a large polishing pad to a polishing platen has become difficult. In the work of bonding a polishing pad to a polishing platen, it is necessary to bond the polishing pad as flatly as possible to the polishing platen. However, if the polishing pad becomes larger in size, air becomes easy to enter between the polishing pad and the polishing platen during bonding process. Since the portion where the air enters projects convexly, there was the problem that defects (e.g., deterioration in polishing uniformity, tear of polishing layer caused by dresser, etc.) due to such a portion could occur in the polishing process of the semiconductor wafer.

PRIOR ART DOCUMENTS

Patent Documents

Patent Document 1: JP-A-2000-117619

SUMMARY OF THE INVENTION

Problems to be Solved by the Invention

An object of the present invention is to provide a laminated polishing pad that can be flatly bonded to a polishing platen even if it is large in size. Another object of the present invention is to provide a method for manufacturing a semiconductor device by using the laminated polishing pad.

Means for Solving the Problems

As a result of investigations for solving the problems described above, the inventors have found that the objects can be achieved by the laminated polishing pad described below, and have completed the invention.

Thus, the invention is directed to a laminated polishing pad, comprising a polishing layer and a support layer with an adhesive member interposed therebetween, wherein
the polishing layer contains 0.5 to 5% by weight of a hydrophilic substance;
the support layer is a layer obtained by integrally molding a cushion layer and a resin film having a thermal dimensional change rate of 1.3 to 12.6%;
the laminated polishing pad has a concavely warped form in the polishing layer side; and
the laminated polishing pad has an average warp amount of 3 to 50 mm at the peripheral edge of the pad.

FIG. 2 is a schematic diagram showing a step of bonding a conventional polishing pad having no warp to a polishing platen. As shown in FIG. 2, in the prior art, one end of a polishing pad 1 is first bonded to one end of a polishing platen 2, and then such bonding is completed by pressing the polishing pad 1 against the polishing platen 2 toward the opposite end from the one end of the polishing pad 1. However, in the case of such a conventional bonding method, if the polishing pad becomes larger in size, it was easy to incorporate air thereinto because the surrounding of the pad was hanged down by its own weight.

On the other hand, FIG. 3 is a schematic diagram showing a step of bonding a laminated polishing pad having a warp of the present invention to a polishing platen. A laminated polishing pad 1 of the present invention has a concavely warped form in a polishing layer 9 side. As shown in FIG. 3, the central portion of the laminated polishing pad 1 is first bonded to the central portion of a polishing platen 2, and then the laminated polishing pad 1 is bonded to the polishing platen 2 with pressing toward the peripheral edge from the central portion of the laminated polishing pad 1, so that the laminated polishing pad 1 can be bonded flatly to the polishing platen 2 without incorporating air.

However, when the laminated polishing pad having a concavely warped form in the polishing layer side is bonded to the polishing platen, an internal stress is generated so that the peripheral edge of the pad is separated from the polishing platen. Thus, the peripheral edge of the pad is likely to be peeled off from the polishing platen. However, since the polishing layer of the laminated polishing pad of the present invention contains 0.5 to 5% by weight of a hydrophilic substance, such a polishing layer swells (expands) with ultrapure water in wetting process, or with a slurry during polishing process. Consequently, the internal stress applied to the peripheral edge of the pad is relaxed, so that the peripheral edge of the pad becomes difficult to be peeled off from the polishing platen.

If the content of the hydrophilic substance is less than 0.5% by weight, the polishing layer hardly swells with ultrapure water or the like, and the internal stress applied to the peripheral edge of the pad is hardly relaxed, so that the peripheral edge of the pad can be easily peeled off from the polishing platen. On the other hand, if the content of the hydrophilic substance exceeds 5% by weight, the polishing layer extremely swells with ultrapure water or the like, the hardness of the polishing layer is decreased, so that the polishing properties are adversely affected.

As the support layer, there is used a support layer that is obtained by integrally molding a cushion layer and a resin film having a thermal dimensional change rate of 1.3 to 12.6%. The use of the support layer makes it possible to adjust the warp amount at the peripheral edge of the pad to 3 to 50 mm. If the resin film has a thermal dimensional change rate of less than 1.3%, the warp amount at the peripheral edge of the pad cannot be 3 mm or more. On the other hand, if the resin film has a thermal dimensional change rate of more than 12.6%, wrinkles are generated in the resin film due to thermal contraction when the cushion layer and the resin film are integrally molded, resulting in failure to produce a support layer.

If the peripheral edge of the pad has an average warp amount of less than 3 mm, the surroundings of the pad are hanged down to be likely to incorporate air at the time of bonding the laminated polishing pad on the polishing platen toward the peripheral edge from the central portion of the laminated polishing pad. On the other hand, if the peripheral edge of the pad has an average warp amount of more than 50 mm, the internal stress applied to the peripheral edge of the pad that is bonded to the polishing platen becomes extremely large, resulting in failure to sufficiently relax the internal stress applied to the peripheral edge of the pad even if the polishing layer swells with ultrapure water. Therefore, the peripheral edge of the pad becomes easy to be peeled off from the polishing platen.

Also, the invention relates to a method for manufacturing a laminated polishing pad, comprising the steps of:

heating a polishing layer containing 0.5 to 5% by weight of a hydrophilic substance to 30 to 100° C.; and bonding the heated polishing layer to a support layer obtained by integrally molding a cushion layer and a resin film having a thermal dimensional change rate of 1.3 to 12.6% with an adhesive member interposed therebetween; wherein the laminated polishing pad has a concavely warped form in the polishing layer side, and the laminated polishing pad has an average warp amount of 3 to 50 mm at the peripheral edge of the pad.

The bonding of the polishing layer to the support layer with the adhesive member interposed therebetween in the state where the polishing layer is heated to 30 to 100° C. makes it possible to produce a laminated polishing pad having a concavely warped form in the polishing layer side and having an average warp amount of 3 to 50 mm at the peripheral edge of the pad. It is considered that the warp of the pad occurs by bonding the polishing layer to the support layer in the state where the polishing layer is stretched under heating and then by shrinking the polishing layer under cooling.

Also, the invention relates to a method for manufacturing a laminated polishing pad, comprising the steps of:

laminating a hot-melt adhesive sheet on the surface of a cushion layer of a support layer obtained by integrally molding the cushion layer and a resin film having a thermal dimensional change rate of 1.3 to 12.6%;

melting or softening a hot-melt adhesive by heating the laminated hot-melt adhesive sheet;

laminating a polishing layer containing 0.5 to 5% by weight of a hydrophilic substance onto the melted or softened hot-melt adhesive, to thereby produce a laminated sheet;

allowing the laminated sheet to pass through between rolls heated to 30 to 100° C. so that the pressure-bonding is performed; and curing the melted or softened hot-melt adhesive of the laminated sheet, wherein the laminated polishing pad has a concavely warped form in the polishing layer side, and the laminated polishing pad has an average warp amount of 3 to 50 mm at the peripheral edge of the pad.

Also, the invention relates to a method for manufacturing a laminated polishing pad, comprising the steps of:

applying a melted or softened hot-melt adhesive onto the surface of a cushion layer of a support layer obtained by integrally molding the cushion layer and a resin film having a thermal dimensional change rate of 1.3 to 12.6%;

laminating a polishing layer containing 0.5 to 5% by weight of a hydrophilic substance onto the melted or softened hot-melt adhesive, to thereby produce a laminated sheet;

allowing the laminated sheet to pass through between rolls heated to 30 to 100° C. so that the pressure-bonding is performed; and curing the melted or softened hot-melt adhesive of the laminated sheet, wherein the laminated polishing pad has a concavely warped form in the polishing layer side, and the laminated polishing pad has an average warp amount of 3 to 50 mm at the peripheral edge of the pad.

The reason for the occurrence of the warp of the laminated polishing pad by the manufacturing method of the present invention is as described above.

The hot-melt adhesive preferably has a melt temperature of 130 to 170° C.

Also, the invention relates to a method for manufacturing a semiconductor device, comprising the step of polishing the surface of a semiconductor wafer by using the laminated polishing pad.

Effect of the Invention

The laminated polishing pad of the present invention has a structure with a concavely warped form in the polishing layer side. Therefore, even if the laminated polishing pad is large in size, it can be flatly bonded to a polishing platen without incorporating air.

MODE FOR CARRYING OUT THE INVENTION

Figure 1:
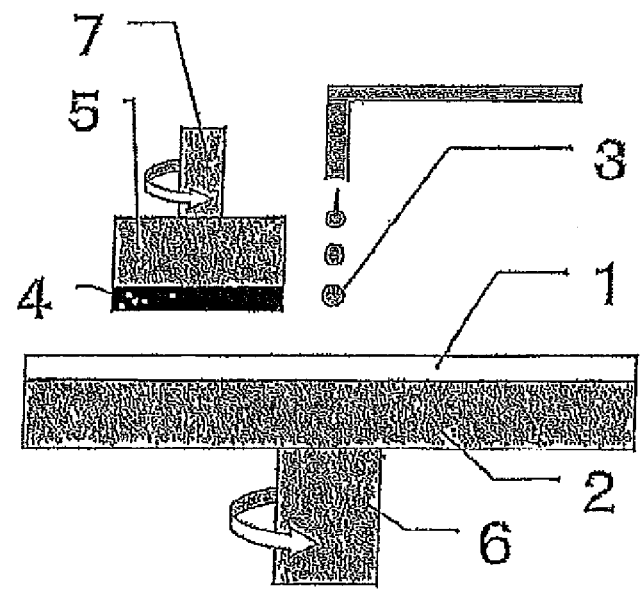
FIG. 1 is a schematic configuration view showing an example of a polishing apparatus used in CMP polishing.
Figure 2:
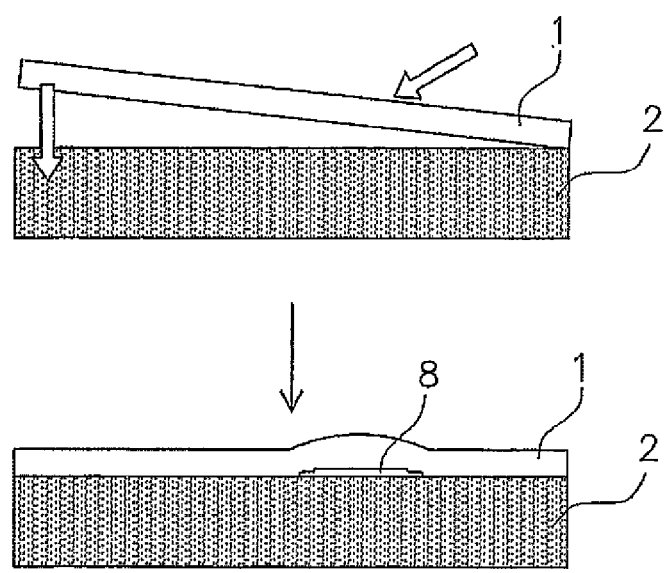
FIG. 2 is a schematic view showing a step of bonding a conventional non-warped polishing pad to a polishing platen.
Figure 3:
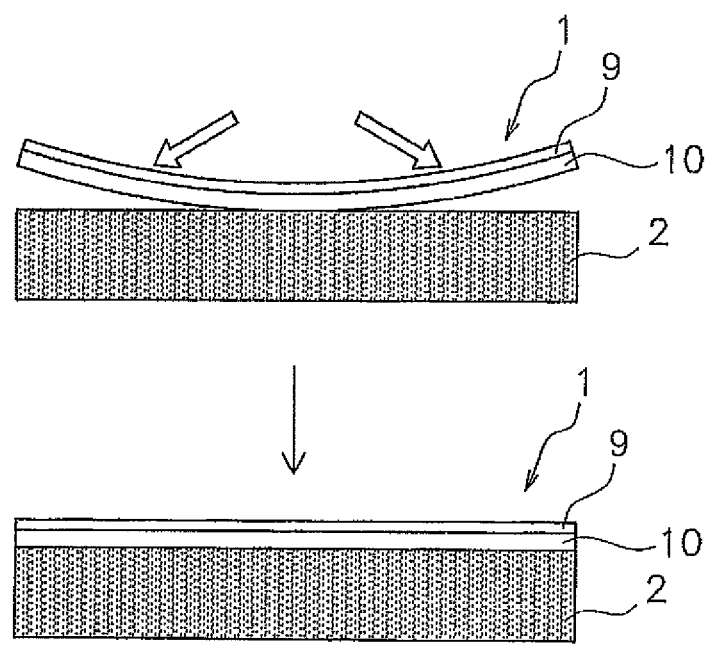
FIG. 3 is a schematic view showing a step of bonding a warped polishing pad according to the present invention to a polishing platen.

The polishing layer used in the present invention may have 0.5 to 5% by weight of a hydrophilic substance, and may be a foam or a non-foam, but is preferably a fine-cell containing foam. The polishing layer preferably contains a hydrophilic substance in an amount of 0.6 to 2% by weight.

The hydrophilic substance in the present invention refers to a substance, 10 g or more of which is soluble in or miscible with 10 g of water. Examples of the hydrophilic substance include polyhydric alcohols such as ethylene glycol and diethylene glycol; ethylene glycol monoethers such as ethylene glycol monomethyl ether, ethylene glycol monoethyl ether, ethylene glycol monobutyl ether, diethylene glycol monomethyl ether, diethylene glycol monoethyl ether, and diethylene glycol monobutyl ether; ethylene glycol diethers such as ethylene glycol dimethyl ether, ethylene glycol diethyl ether, ethylene glycol dibutyl ether, diethylene glycol dimethyl ether, diethylene glycol diethyl ether, and diethylene glycol dibutyl ether; tetraethylene di(meth)acrylate; polyethylene glycols obtained by addition polymerization of ethylene oxide to diethylene glycol; polysiloxane ethers obtained by addition polymerization of ethylene oxide to polysiloxane; and the like. The hydrophilic substance is preferably a substance that does not react with the resin constituting the polishing layer and the starting material thereof, and it is particularly preferable to use ethylene glycol diether.

As a resin constituting the polishing layer, for example, the material may be one or a mixture of two or more of polyurethane resin, polyester resin, polyamide resin, acrylic resin, polycarbonate resin, halogen-containing resin (e.g., polyvinyl chloride, polytetrafluoroethylene, or polyvinylidene fluoride), polystyrene, olefin resin (e.g., polyethylene or polypropylene), epoxy resin, photosensitive resin, and others. Polyurethane resin is a particularly preferred material for forming the polishing layer because it has high abrasion resistance and because urethane polymers with the desired physical properties can be easily obtained by varying the raw material composition. Hereinafter, a description is given on polyurethane resin foam as a typical material for forming the polishing layer.

The polyurethane resin is constituted of an isocyanate component, a polyol component (a high-molecular-weight polyol, a low-molecular-weight polyol and the like) and a chain extender.

As the isocyanate component, a compound known in the field of polyurethane can be used without particular limitation. The isocyanate component includes, for example, aromatic diisocyanates such as 2,4-toluene diisocyanate, 2,6-toluene diisocyanate, 2,2'-diphenyl methane diisocyanate, 2,4'-diphenyl methane diisocyanate, 4,4'-diphenyl methane diisocyanate, 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethyl hexamethylene diisocyanate and 1,6-hexamethylene diisocyanate, and cycloaliphatic diisocyanates such as 1,4-cyclohexane diisocyanate, 4,4'-dicyclohexyl methane diisocyanate, isophorone diisocyanate and norbornane diisocyanate. These may be used alone or as a mixture of two or more thereof.

As the high-molecular-weight polyol, a compound known in the field of polyurethane can be used without particular limitation. The high-molecular-weight polyol includes, for example, polyether polyols represented by polytetramethylene ether glycol and polyethylene glycol, polyester polyols represented by polybutylene adipate, polyester polycarbonate polyols exemplified by reaction products of polyester glycols such as polycaprolactone polyol and polycaprolactone with alkylene carbonate, polyester polycarbonate polyols obtained by reacting ethylene carbonate with a multivalent alcohol and reacting the resulting reaction mixture with an organic dicarboxylic acid, and polycarbonate polyols obtained by ester exchange reaction of a polyhydroxyl compound with aryl carbonate. These may be used singly or as a mixture of two or more thereof.

Besides the above high-molecular-weight polyol described in the above as a polyol component, it is preferred to concomitantly use a low-molecular-weight polyol such as ethyleneglycol, 1,2-propylene glycol, 1,3-propylene glycol, 1,2-butanediol, 1,3-butanediol, 1,4-butanediol, 2,3-butanediol, 1,6-hexanediol, neopentylglycol, 1,4-cyclohexanedimethanol, 3-methyl-1,5-pentanediol, diethyleneglycol, triethyleneglycol, 1,4-bis(2-hydroxyethoxy)benzene, trimethylolpropane, glycerin, 1,2,6-hexanetriol, pentaerythritol, tetramethylol cyclohexane, methylglucoside, sorbitol, mannitol, dulcitol, sucrose, 2,2,6,6-tetrakis(hydroxymethyl)cyclohexanol, diethanolamine, N-methyldiethanolamine and triethanol amine. Low-molecular-weight polyamine such as ethylenediamine, tolylenediamine, diphenylmethanediamine, and diethylenetriamine may be used. Alcohol amine such as monoethanol amine, 2-(2-aminoethylamino) ethanol and monopropanol amine may be used. These may be used singly or in combination of two or more kinds. The content of the low-molecular-weight polyol, the low-molecular-weight polyamine, or other materials is not particularly limited, and may be appropriately determined depending on the properties required of the polishing layer to be manufactured.

In the case where a polyurethane resin foam is produced by means of a prepolymer method, a chain extender is used in curing of a prepolymer. A chain extender is an organic compound having at least two active hydrogen groups and examples of the active hydrogen group include: a hydroxyl group, a primary or secondary amino group, a thiol group (SH) and the like. Concrete examples of the chain extender include: polyamines such as 4,4'-methylenebis(o-chloroaniline) (MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethylene glycol-di-p-aminobenzoate, polytetramethylene oxide-di-p-aminobenzoate, 4,4'-diamino-3,3',5,5'-tetraethyldiphenylmethane, 4,4'-diamino-3,3'-diisopropyl-5.5'-dimethyldiphenylmethane, 4,4'-diamino-3,3',5,5'-tetraisopropyldiphenylmethane, 1,2-bis(2-aminophenylthio)ethane, 4,4'-diamino-3,3'-diethyl-5.5'-dimethyldiphenylmethane, N,N'-di-sec-butyl-4,4'-diaminophenylmethane, 3,3'-diethyl-4,4'-diaminodiphenylmethane, m-xylylenediamine, N,N'-di-sec-butyl-p-phenylenediamine, m-phenylenediamine and p-xylylenediamine; the low-molecular-weight polyol; and the low-molecular-weight polyamine. The chain extenders described above may be used either alone or in mixture of two kinds or more.

A ratio between an isocyanate component, a polyol component and a chain extender in the invention can be altered in various ways according to molecular weights thereof, desired physical properties of a polishing pad and the like. In order to obtain a polishing pad with desired polishing characteristics, a ratio of the number of isocyanate groups in an isocyanate component relative to a total number of active hydrogen groups (hydroxyl groups+amino groups) in a polyol component and a chain extender is preferably in the range of from 0.80 to 1.20 and more preferably in the range of from 0.99 to 1.15. When the number of isocyanate groups is outside the aforementioned range, there is a tendency that curing deficiency is caused, required specific gravity and hardness are not obtained, and polishing property is deteriorated.

A polyurethane resin foam can be produced by applying a melting method, a solution method or a known polymerization technique, among which preferable is a melting method, consideration being given to a cost, a working environment and the like.

Manufacture of a polyurethane resin foam is enabled by means of either a prepolymer method or a one shot method, of which preferable is a prepolymer method in which an isocyanate-terminated prepolymer is synthesized from an isocyanate component and a polyol component in advance, with which a chain extender is reacted since physical properties of an obtained polyurethane resin is excellent.

Manufacturing methods of a polyurethane resin foam include: a method in which hollow beads are added, a mechanical foaming method, a chemical foaming method and the like.

Particularly, preferred is a mechanical foaming method using a silicone-based surfactant which is a copolymer of polyalkylsiloxane and polyether and has no an active hydrogen group.

A stabilizer such as antioxidant, a lubricant, a pigment, a filler, an antistatic agent and other additives may be added, as needed.

The polyurethane resin foam may be of a closed cell type or an open cell type.

Production of the polyurethane resin foam may be in a batch system where each component is weighed out, introduced into a vessel and mixed or in a continuous production system where each component and a non-reactive gas are continuously supplied to, and stirred in, a stirring apparatus and the resulting forming reaction liquid is transferred to produce molded articles.

A manufacturing method of a polyurethane resin foam may be performed in ways: in one of which a prepolymer which is a raw material from which a polyurethane foam is made is put into a reactor, thereafter a chain extender is mixed into the prepolymer, the mixture is agitated, thereafter the mixture is cast into a mold with a predetermined size to thereby prepare a block and the block is sliced with a slicer like a planer or a band saw; and in another of which in the step of casting into the mold, a thin sheet may be directly produced. Besides, a still another way may be adopted in which a resin of raw material is melted, the melt is extruded through a T die to thereby mold a polyurethane resin foam directly in the shape of a sheet.

An average cell diameter of a polyurethane resin foam is preferably in the range of from 30 to 80 μm and more preferably in the range of from 30 to 60 μm. If an average cell diameter falls outside the range, a tendency arises that a polishing rate is decreased and a planarity of an object to be polished (a wafer) after polishing is reduced.

Preferably, the polyurethane resin foam has a specific gravity ranging from 0.5 to 1.3. When the specific gravity is less than 0.5, the surface strength of the polishing layer decreases, so that the planarity of the object to be polished tends to decrease. When the specific gravity is larger than 1.3, the cell number on the surface of the polishing layer decreases, so that the polishing rate tends to decrease despite excellent planarity.

Preferably, the polyurethane resin foam has a hardness measured by ASKER D hardness meter, ranging from 40 to 75 degrees. When the ASKER D hardness is less than 40 degrees, the planarity of the object to be polished decreases, while when the hardness is more than 75 degrees, the uniformity of the object to be polished tends to decrease despite excellent planarity.

Preferably, a polishing surface of the polishing layer, which comes into contact with an object to be polished have a asperity structure provided for retaining and refreshing a slurry. A polishing layer made of a foam has a number of openings in the polishing surface, and has a function of retaining and refreshing a slurry. By forming an asperity structure on the polishing surface, it is possible to conduct retention and refreshment of the slurry more efficiently, and to prevent the object to be polished from breaking due to adsorption of the material to be polished. The shape of the asperity structure is not particularly limited insofar as it is able to retain and refresh a slurry, and for example, XY grating groove, concentric ring groove, through-hole, non-through-hole, polygonal column, circular cylinder, spiral groove, eccentric ring groove, radial groove, and combination thereof can be recited. These asperity structures generally have regularity, however, groove pitch, groove width, groove depth and the like may be varied by a certain range for achieving desired retention and refreshment of slurry.

The polishing layer may have any shape such as a circular shape or an elongated shape. The size of the polishing layer may be appropriately adjusted depending on the polishing apparatus to be used. When the polishing layer is circular, it may have a diameter of about 30 to about 150 cm, and when the polishing layer has an elongated shape, it may have a length of about 5 to about 15 m and a width of about 60 to about 250 cm.

The thickness of the polishing layer is generally, but is not limited to, about 0.8 to 4 mm, and preferably 1.2 to 2.5 mm.

The polishing layer may also have a transparent member for use in detecting an optical end point while polishing is performed.

The support layer used in the present invention is a support layer obtained by integrally molding a cushion layer and a resin film having a thermal dimensional change rate of 1.3 to 12.6%.

The cushion layer is necessary for CMP to achieve both good planarity and good uniformity, which are usually in a trade-off relationship. The term "planarity" refers to the flatness of a patterned part formed by polishing an object to be polished having fine irregularities, which are produced in a patterning process. The term "uniformity" refers to the entire uniformity of an object to be polished. The characteristics of the polishing layer contribute to an improvement in planarity, and the characteristics of the cushion layer contribute to an improvement in uniformity.

Examples of the cushion layer include nonwoven fiber fabrics such as polyester nonwoven fabrics, nylon nonwoven fabrics, and acrylic nonwoven fabrics; resin impregnated nonwoven fabrics such as polyurethane impregnated polyester nonwoven fabrics; polymeric resin foams such as polyurethane foams and polyethylene foams; rubber resins such butadiene rubber and isoprene rubber; and photosensitive resins, etc.

The thickness of the cushion layer is preferably, but not limited to, 300 to 1,800 μm, more preferably 700 to 1,400 μm.

Because the cushion layer is poor in its rigidity, defects such as generation of wrinkles or adhesion failure during bonding process are likely to occur. In order to prevent such defects, a resin film is provided on one side of the cushion layer to thereby impart rigidity.

A resin film having a thermal dimensional change rate of 1.3 to 12.6% after heating at 150° C. for 30 minutes is used. Preferred is a resin film having a thermal dimensional change rate of 1.4 to 3%. Examples of the resin film include polyester films such as a polyethylene terephthalate film; polyolefin films such as a polyethylene film and a polypropylene film; polyamide films; acrylic resin films; methacrylic resin films; polystyrene films; and the like. Of these, it is preferable to use a polyester film, and it is particularly preferable to use a polyethylene terephthalate film.

The thickness of the resin film is preferably, but not limited to, 10 to 150 μm, more preferably 20 to 100 μm.

The support layer used in the present invention can be produced, for example, by a method where a resin film is bonded to one side of a cushion layer with the use of an adhesive; a method where a cushion layer is directly formed by applying a cushion layer-forming material onto a resin film, followed by curing.

The laminated polishing pad of the present invention is produced by bonding the polishing layer to the support layer with an adhesive member interposed therebetween. For example, the laminated polishing pad can be manufactured by the following methods.

Manufacture Method 1

First, a polishing layer is heated to 30 to 100° C. Afterwards, the polishing layer that has been heated to the above temperature and the cushion layer side of the support layer are pressure-bonded with an adhesive member interposed therebetween. A common pressure-sensitive adhesive may be used as the adhesive member, and a double-sided tape in which a pressure-sensitive adhesive layer is provided on both surfaces of the substrate may also be used. An examples of the pressure-bonding method includes a method of passing through between rolls. After the bonding, the polishing layer is shrunk by cooling to obtain a laminated polishing pad having a concavely warped form in the polishing layer side. When the support layer is cut into the size of the polishing layer, it is preferable to cut the support layer prior to cooling the polishing layer, i.e., before the polishing layer has a concave form by the shrinkage of the polishing layer. If the support layer is cut after the polishing layer has a concave form by the shrinkage of the polishing layer, it becomes difficult to accurately cut the support layer into the size of the polishing layer.

Manufacture Method 2

First, a hot-melt adhesive sheet is laminated onto the cushion layer of the support layer.

The hot-melt adhesive sheet may be an adhesive layer formed of a hot-melt adhesive or may be a double-sided tape in which the adhesive layer is provided on both sides of the substrate.

The hot-melt adhesive to be used is not particularly limited, but a polyester-based hot-melt adhesive is preferably used.

The polyester-based hot-melt adhesive contains at least a polyester resin as a base polymer and an epoxy resin having two or more glycidyl groups per molecule, in which the epoxy resin is a crosslinking component.

The polyester resin may be any known polyester resin which is obtained by condensation polymerization of an acid and a polyol or other polymerization processes. In particular, the polyester resin is preferably a crystalline polyester resin.

Examples of the acid include aromatic dicarboxylic acids, aliphatic dicarboxylic acids, and alicyclic dicarboxylic acids, etc. These may be used alone or in combination of two or more.

Examples of aromatic dicarboxylic acids include terephthalic acid, isophthalic acid, phthalic anhydride, α-naphthalene dicarboxylic acid, β-naphthalene dicarboxylic acid, and their ester forms, etc.

Examples of aliphatic dicarboxylic acids include succinic acid, glutaric acid, adipic acid, pimelic acid, suberic acid, azelaic acid, sebacic acid, undecylenic acid, dodecanedioic acid, and their ester forms, etc.

Examples of alicyclic dicarboxylic acids include 1,4-cyclohexane dicarboxylic acid, tetrahydrophthalic anhydride, hexahydrophthalic anhydride, etc.

An unsaturated acid such as maleic acid, fumaric acid, or dimer acid, a polycarboxylic acid such as trimellitic acid or pyromellitic acid, or other acids may also be used as the acid in combination with any of the above acids.

Examples of the polyol include dihydric alcohols such as aliphatic glycols and alicyclic glycols, and polyhydric alcohols. These may be used alone or in combination of two or more.

Examples of aliphatic glycols include ethylene glycol, 1,2-propylene glycol, 1,3-propylene glycol, 1,3-butanediol, 1,4-butanediol, 1,5-pentanediol, 1,6-hexanediol, 1,8-octanediol, 1,9-nonanediol, neopentyl glycol, 3-methylpentanediol, 2,2,3-trimethylpentanediol, diethylene glycol, triethylene glycol, dipropylene glycol, etc.

Examples of alicyclic glycols include 1,4-cyclohexanedimethanol, hydrogenated bisphenol A, etc.

Examples of polyhydric alcohols include glycerin, trimethylolethane, trimethylolpropane, pentaerythritol, etc.

The crystalline polyester resin can be synthesized by known methods. Examples include melt polymerization methods including adding raw materials and a catalyst and heating the mixture at a temperature equal to or higher than the melting point of the desired product, solid-phase polymerization methods including performing polymerization at a temperature equal to or lower than the melting point of the desired product, and solution polymerization methods using a solvent, etc. Any of these methods may be used.

The crystalline polyester resin preferably has a melting point of 100 to 200° C. If the melting point is lower than 100° C., the adhesive strength of the hot-melt adhesive can be lowered by heat generated during polishing. If the melting point is higher than 200° C., a higher temperature will be needed to melt the hot-melt adhesive, which may warp the laminated polishing pad and tend to have an adverse effect on the polishing characteristics.

The crystalline polyester resin preferably has a number average molecular weight of 5,000 to 50,000. If the number average molecular weight is less than 5,000, the hot-melt adhesive may have lower mechanical characteristics, so that a sufficient level of tackiness and durability may fail to be obtained. If the number average molecular weight is more than 50,000, a production failure such as gelation may occur in the process of synthesizing the crystalline polyester resin, or the hot-melt adhesive may tend to have lower performance.

Examples of the epoxy resin include aromatic epoxy resins such as bisphenol A type epoxy resins, brominated bisphenol A type epoxy resins, bisphenol F type epoxy resins, bisphenol AD type epoxy resins, stilbene type epoxy resins, biphenyl type epoxy resins, bisphenol A novolac type epoxy resins, cresol novolac type epoxy resins, diaminodiphenylmethane type epoxy resins, and polyphenyl-based epoxy resins such as tetrakis(hydroxyphenyl)ethane-based epoxy resins, fluorene-containing epoxy resins, and epoxy resins containing a triglycidyl isocyanurate moiety or a heteroaromatic ring (such as a triazine ring); and non-aromatic epoxy resins such as aliphatic glycidyl ether type epoxy resins, aliphatic glycidyl ester type epoxy resins, alicyclic glycidyl ether type epoxy resins, and alicyclic glycidyl ester type epoxy resins. These may be used alone or in combination of two or more.

Among them, cresol novolac type epoxy resins are preferably used in view of tackiness to the polishing layer during polishing.

The epoxy resin is necessarily added in an amount of 2 to 10 parts by weight, preferably in an amount of 3 to 7 parts by weight, to 100 parts by weight of the polyester resin as a base polymer.

The hot-melt adhesive may also contain known additives such as a softener such as an olefin resin, a tackifier, a filler, a stabilizer, and a coupling agent. The adhesive may also contain a known inorganic filler such as talc and other materials.

The hot-melt adhesive preferably has a melting temperature (a melting point) of 130 to 170° C.

The hot-melt adhesive preferably has a specific gravity of 1.1 to 1.3.

The hot-melt adhesive preferably has a melt flow index (MI) of 16 to 26 g/10 minutes under the conditions of 150° C. and a load of 2.16 kg.

The thickness of the adhesive layer formed of the hot-melt adhesive is preferably 10 to 200 μm, and more preferably 50 to 130 μm.

A double-sided tape including a backing and the adhesive layers provided on both sides of the backing may also be used instead of the adhesive layer. The backing can prevent a slurry from permeating to the support layer side, so that delamination between the support layer and the adhesive layer can be prevented.

Examples of the backing include polyester films such as polyethylene terephthalate films and polyethylene naphthalate films; polyolefin films such as polyethylene films and polypropylene films; nylon films; and polyimide films, etc. Among them, polyester films are preferably used, which have high ability to prevent water permeation.

The surface of the backing may be subjected to an adhesion-facilitating treatment such as a corona treatment or a plasma treatment.

The thickness of the backing is preferably, but not limited to, 10 to 200 μm, more preferably 15 to 55 μm, in view of transparency, flexibility, stiffness, dimensional stability during heating, and other properties.

When the double-sided tape is used, the thickness of the adhesive layer is preferably from 10 to 200 μm, more preferably from 50 to 130 μm.

Then, the laminated hot-melt adhesive sheet is heated to melt or soften the hot-melt adhesive. In the case of softening, the laminated hot-melt adhesive sheet is preferably heated to a temperature within −10° C. from the melting temperature of the hot-melt adhesive, and more preferably to a temperature within −5° C. from the melting temperature of the hot-melt adhesive. The method of melting or softening the hot-melt adhesive sheet is not particularly limited, and an example thereof include a method of heating the surface of the hot-melt adhesive sheet with an infrared heater while conveying the sheet on a conveyer belt.

Then, a laminated sheet is produced by laminating the polishing layer on the melt or softened hot-melt adhesive and the laminated sheet is pressure-bonded by passing through rolls heated to 30 to 100° C. Instead of using the hot-melt adhesive sheet, the melt or softened hot-melt adhesive may be applied onto the cushion layer of the support layer. After the bonding, the melt or softened hot-melt adhesive is cured by cooling. At this time, the polishing layer is shrunken to provide a polishing pad having a concavely warped form in the polishing layer side. When the support layer is cut into the size of the polishing layer, it is preferable to cut the support layer before the polishing layer has a concave form by the shrinkage of the polishing layer. If the support layer is cut after the polishing layer has a concave form by the shrinkage of the polishing layer, it becomes difficult to accurately cut the support layer into the size of the polishing layer.

The laminated polishing pad obtained by the manufacture method of the present invention has a concavely warped form in the polishing layer side, and has an average warp amount of the peripheral edge of the pad of 3 to 50 mm, preferably 5 to 15 mm.

The laminated polishing pad of the present invention may be a circular or long form. The size of the laminated polishing pad can be appropriately adjusted according to the polishing apparatus to be used, and the diameter in the case of a circular form is about 30 to 150 cm, and the length in the case of a long form is about 5 to 15 m in length and about 60 to 250 cm in width.

The laminated polishing pad of the present invention may be provided with a double-sided tape on the resin film side of the support layer.

A semiconductor device is fabricated after operation in a step of polishing a surface of a semiconductor wafer with the polishing pad. The term, a semiconductor wafer, generally means a silicon wafer on which a wiring metal and an oxide layer are stacked. No specific limitation is imposed on a polishing method of a semiconductor wafer or a polishing apparatus, and polishing is performed with a polishing apparatus equipped, as shown in FIG. 1, with a polishing platen 2 supporting a laminated polishing pad 1, a polishing head 5 holding a semiconductor wafer 4, a backing material for applying a uniform pressure against the wafer and a supply mechanism of a polishing agent 3. The laminated polishing pad 1 is mounted on the polishing platen 2 by adhering the pad to the platen with a double-sided adhesive tape. The polishing platen 2 and the polishing head are disposed so that the laminated polishing pad 1 and the semiconductor wafer 4 supported or held by them oppositely face each other and provided with respective rotary shafts 6 and 7. A pressure mechanism for pressing the semiconductor wafer 4 to the laminated polishing pad 1 is installed on the polishing head 5 side. During polishing, the semiconductor wafer 4 is polished by being pressed against the laminated polishing pad 1 while the polishing platen 2 and the polishing head 5 are rotated and a slurry is fed. No specific limitation is placed on a flow rate of the slurry, a polishing load, a polishing platen rotation number and a wafer rotation number, which are properly adjusted.

Protrusions on the surface of the semiconductor wafer 4 are thereby removed and polished flatly. Thereafter, a semiconductor device is produced therefrom through dicing, bonding, packaging etc. The semiconductor device is used in an arithmetic processor, a memory etc.

EXAMPLES

Description will be given of the invention with examples, while the invention is not limited to description in the examples.

[Methods for Measurement and Evaluation]

(Measurement of Melting Temperature)

The melting temperature (melting point) of the polyester-based hot-melt adhesive was measured at a rate of temperature rise of 20° C./minute using TOLEDO DSC822 (manufactured by Mettler-Toledo International Inc.).

(Measurement of Specific Gravity)

The measurement was performed according to JIS Z 8807-1976. A 4 cm×8.5 cm adhesive layer strip (of arbitrary thickness) was cut from the polyester-based hot-melt adhesive and used as a sample for the specific gravity measurement. The sample was allowed to stand in an environment at a temperature of 23° C.±2° C. and a humidity of 50%±5% for 16 hours. The sample was measured for specific gravity using a specific gravity meter (manufactured by Sartorius AG).

(Measurement of Melt Flow Index (MI))

The melt flow index of the polyester-based hot-melt adhesive was measured according to ASTM-D-1238 under the conditions of 150° C. and 2.16 kg.

(Measurement of Thermal Dimensional Change Rate)

The thermal dimensional change rates before and after heating the resin film at 150° C. for 30 minutes were measured according to JIS C 2318.

(Measurement of Average Warp Amount at Peripheral Edge of Pad)

The produced laminated polishing pad was allowed to stand still on a horizontal table, and the height (lifting) from the table was measured at four places of every 90 degrees from the largest warp at the peripheral edge of the pad.

(Evaluation of in-Plane Uniformity)

Using ARW-8C1MS (manufactured by MAT Inc.) as a polishing apparatus, the produced laminated polishing pad was bonded to the polishing apparatus. The dressing of the laminated polishing pad was performed for 20 minutes using a diamond dresser (MECY #100 type, manufactured by MMC). Subsequently, using the laminated polishing pad, a 300 mm silicon wafer having a 1 μm-thick thermal oxide film deposited thereon was polished for 1 minute (initial polishing). The conditions for the polishing were as follows: silica slurry SS12 (manufactured by Cabot Microelectronics Co., Ltd.) was supplied at a flow rate of 200 ml/minute during polishing; the polishing loading was 275 hPa; the number of revolutions of the polishing platen was 60 rpm; and the number of revolutions of the wafer was 60 rpm. The in-plane uniformity (%) was calculated as described below. That is, the thicknesses were measured at 99 points (excluding the position of 3 mm from the wafer edge) of 3 mm intervals on the wafer diameter line before and after the polishing. The maximum polishing rate, the minimum polishing rate, and the average polishing rate were determined from the thickness measured at 99 points on the wafer before and after the polishing, and the in-plane uniformity (%) was calculated by substituting the resulting values into the formula below. The thickness measurement was performed by using an interference film thickness measuring instrument (manufactured by Nanometrics Inc.). Thereafter, the laminated polishing pad was dressed with the diamond dresser for 5 hours. Then, the wafer was polished for 1 minute in the same manner as above (polishing after 5 hours), and the in-plane uniformity (%) was calculated. As the value of the in-plane uniformity is small, it means that the wafer surface has high uniformity. When the value of the in-plane uniformity was 15% or less, the case was evaluated as good (○) and when the value of the in-plane uniformity was more than 15%, the case was evaluated as bad (×).

$$\text{In-plane uniformity (\%)} = \{(\text{Maximum polishing rate} - \text{Minimum polishing rate})/(\text{Average polishing rate} \times 2)\} \times 100$$

Example 1

(Production of Polishing Layer)

To a polymerization vessel were added 100 parts by weight of a polyether-based prepolymer (Adiprene L-325, manufactured by Uniroyal Chemical Co., Ltd.), 3 parts by weight of a silicone-based surfactant (B8465, manufactured by Goldschmidt Chemical Corporation), and 0.8 parts by weight of diethylene glycol diethyl ether and then mixed. The mixture was adjusted to 80° C. in the vessel and was defoamed under reduced pressure. Subsequently, the reaction system was vigorously stirred for about 4 minutes with a stirring blade at a rotational speed of 900 rpm so that air bubbles were incorporated into the reaction system. Thereto was added 26 parts by weight of MOCA (Cureamine MT, manufactured by Ihara Chemical Industry Co., Ltd.), which had been previously adjusted to 120° C. The liquid mixture was stirred for about 1 minute and then poured into a loaf-shaped open mold (casting vessel). At the point when the liquid mixture lost its fluidity, it was placed in an oven, and subjected to postcuring at 100° C. for 16 hours, so that a polyurethane resin foam block was obtained.

While heated at about 80° C., the polyurethane resin foam block was sliced using a slicer (VGW-125, manufactured by Amitec Corporation), so that a polyurethane resin foam sheet (specific gravity: 0.85, Asker D hardness: 55 degrees) was obtained. Subsequently, the surface of the sheet was buffed with a buffing machine (manufactured by Amitec Corporation) until the sheet had a thickness of 1.27 mm. As a result, the sheet had adjusted thickness accuracy. The buffed sheet was punched to form a disc with a diameter of 78 cm, and processing of concentric circular grooves each with a width of 0.25 mm, a pitch of 1.5 mm, and a depth of 0.45 mm was performed on the surface of the sheet using a grooving machine (manufactured by Techno Corporation) so that a polishing layer was produced.

(Production of Support Layer)

A urethane foam composition was applied onto a 50 μm-thick PET film (Tetoron G2, thermal dimensional change rate: 1.7%, manufactured by Teijin DuPont Films Japan Ltd.) and cured to form a cushion layer (specific gravity: 0.5; Asker C hardness: 50 degrees; thickness: 0.8 mm) so that a support layer was produced.

(Production of Laminated Polishing Pad)

An adhesive layer (100 μm in thickness) made of a polyester-based hot-melt adhesive (melting point: 142° C., specific gravity: 1.22, melt flow index: 21 g/10 minutes) containing 100 parts by weight of a crystalline polyester resin (Byron GM420, manufactured by Toyobo Co., Ltd.) and 5 parts by weight of an o-cresol novolac type epoxy resin (EOCN 4400, manufactured by Nippon Kayaku Co., Ltd.) having at least two glycidyl groups in one molecule was laminated on the cushion layer of the support layer. The surface of the adhesive layer was heated to 150° C. using an infrared heater so that the adhesive layer was melted. Subsequently, using a laminator, the produced polishing layer was laminated onto the melted adhesive layer, so that a laminated sheet was obtained. The laminated sheet was allowed to pass through between rolls having 50° C. and pressure-bonded. Thereafter, the laminated sheet was cut into the size of the polishing layer. Further, a pressure-sensitive double-sided tape (442JA, manufactured by 3M) was bonded to the PET film side of the support layer with the use of a laminator, so that a laminated polishing pad was produced. The laminated polishing pad was warped so as to have a concave form in the polishing layer side.

Example 2

A laminated polishing pad was produced in the same manner as in Example 1, except that the roll temperature was changed from 50° C. to 31° C. The laminated polishing pad was warped so as to have a concave form in the polishing layer side.

Example 3

A laminated polishing pad was produced in the same manner as in Example 1, except that the roll temperature was changed from 50° C. to 98° C. The laminated polishing pad was warped so as to have a concave form in the polishing layer side.

Example 4

A laminated polishing pad was produced in the same manner as in Example 1, except that the blending amount of diethylene glycol diethyl ether in the production of the polishing layer was changed from 0.8 parts by weight to 6.4 parts by weight. The laminated polishing pad was warped so as to have a concave form in the polishing layer side.

Example 5

A laminated polishing pad was produced in the same manner as in Example 1, except that a 100 μm-thick PET film (Lumirror H10, thermal dimensional change rate: 1.3%, manufactured by Toray Industries, Inc.) was used in place of Tetoron G2 in the production of the support layer. The laminated polishing pad was warped so as to have a concave form in the polishing layer side.

Example 6

A laminated polishing pad was produced in the same manner as in Example 1, except that a 100 μm-thick PET film (Lumirror HT50, thermal dimensional change rate: 12.6%, manufactured by Toray Industries, Inc.) was used in place of Tetoron G2 in the production of the support layer. The laminated polishing pad was warped so as to have a concave form in the polishing layer side.

Comparative Example 1

A laminated polishing pad was produced in the same manner as in Example 1, except that diethylene glycol diethyl ether was not blended in the production of the polishing layer. The laminated polishing pad was warped so as to have a concave form in the polishing layer side.

Comparative Example 2

A laminated polishing pad was produced in the same manner as in Example 1, except that the blending amount of diethylene glycol diethyl ether in the production of the polishing layer was changed from 0.8 parts by weight to 15 parts by weight. The laminated polishing pad was warped so as to have a concave form in the polishing layer side.

Comparative Example 3

A laminated polishing pad was produced in the same manner as in Example 1, except that the roll temperature was changed from 50° C. to 23° C. The laminated polishing pad was nearly flat.

Comparative Example 4

A laminated polishing pad was produced in the same manner as in Example 1, except that the roll temperature was changed from 50° C. to 130° C. The laminated polishing pad was very warped so as to have a concave form in the polishing layer side.

Comparative Example 5

A laminated polishing pad was produced in the same manner as in Example 1, except that a 25 μm-thick PEN film (Teonex Q51, thermal dimensional change rate: 1.0%, manufactured by Teijin DuPont Films Japan Limited) was used in place of Tetoron G2 in the production of the support layer. The laminated polishing pad was nearly flat.

Comparative Example 6

When a urethane foam composition was applied onto the surface of a 25 μm-thick PET film (Lumirror HT50, thermal dimensional change rate: 15%, manufactured by Toray Industries, Inc.) and then heated, a support layer could not be produced because the PET film had been shrunken.

TABLE 1

|  | Example 1 | Example 2 | Example 3 | Example 4 | Example 5 | Example 6 |
| --- | --- | --- | --- | --- | --- | --- |
| Content of hydrophilic substance (% by weight) | 0.6 | 0.6 | 0.6 | 4.7 | 0.6 | 0.6 |
| Thermal dimensional change rate (%) | 1.7 | 1.7 | 1.7 | 1.7 | 1.3 | 12.6 |
| Roll temperature (° C.) | 50 | 31 | 98 | 50 | 50 | 50 |
| Average warp amount (mm) | 10 | 5 | 47 | 12 | 9 | 15 |
| In-plane uniformity (%) Initial stage | 11 (○) | 9 (○) | 13 (○) | 10 (○) | 11 (○) | 12 (○) |
| In-plane uniformity (%) After 5 hours | 10 (○) | 8 (○) | 12 (○) | 12 (○) | 9 (○) | 10 (○) |

TABLE 1-continued

|  | Comparative Example 1 | Comparative Example 2 | Comparative Example 3 | Comparative Example 4 | Comparative Example 5 |
|---|---|---|---|---|---|
| Content of hydrophilic substance (% by weight) | 0 | 10 | 0.6 | 0.6 | 0.6 |
| Thermal dimensional change rate (%) | 1.7 | 1.7 | 1.7 | 1.7 | 1.0 |
| Roll temperature (° C.) | 50 | 50 | 23 | 130 | 50 |
| Average warp amount (mm) | 15 | 13 | 1 | 78 | 2 |
| In-plane uniformity (%) Initial stage | 21 (x) | 15 (o) | 12 (o) | — | 13 (o) |
| In-plane uniformity (%) After 5 hours | — | 28 (x) | — | — | — |

The laminated polishing pads of Examples 1 to 6 had a good workability in bonding to the polishing platen because they had a moderate warp. The in-plane uniformity after initial dressing or after long-term dressing was also good. On the other hand, the laminated polishing pad of Comparative Example 1 had a good workability in bonding to the polishing platen because it had a moderate warp, but since a hydrophilic substance is not blended into the polishing layer, the initial in-plane uniformity after initial dressing was poor, and lifting and peeling off occurred in the pad edge after long-term dressing. The laminated polishing pad of Comparative Example 2 had a good workability in bonding to the polishing platen because it had a moderate warp, but since a hydrophilic substance was contained in a large amount in the polishing layer, the polishing layer swelled to worsen the initial in-plane uniformity after long-term dressing. Since the laminated polishing pads of Comparative Examples 3 and 5 were almost flat without warping, they were not able to be flatly bonded to the polishing platen due to the incorporation of air. Therefore, cracks were generated in the polishing layer after long-term dressing because the dresser had excessively contacted with the projecting portion. The polishing pad of Comparative Example 4 could not be bonded to the polishing platen for the reason that its warp was too large.

INDUSTRIAL APPLICABILITY

A laminated polishing pad of the invention is capable of performing planarization materials requiring a high surface planarity such as optical materials including a lens and a reflective mirror, a silicon wafer, a glass substrate or an aluminum substrate for a hard disk and a product of general metal polishing with stability and a high polishing efficiency. A laminated polishing pad of the invention is preferably employed, especially, in a planarization step of a silicon wafer or a device on which an oxide layer or a metal layer has been formed prior to further stacking an oxide layer or a metal layer thereon.

DESCRIPTION OF REFERENCE SIGNS

In the drawings, reference numeral 1 represents a laminated polishing pad, 2 a polishing platen, 3 a polishing agent (slurry), 4 an object to be polished (semiconductor wafer), 5 a support (polishing head), 6 and 7 each a rotating shaft, 8 air, 9 a polishing layer, 10 a support layer.

The invention claimed is:

1. A laminated polishing pad, comprising a polishing layer and a support layer with an adhesive member interposed therebetween, wherein
   the polishing layer contains 0.5 to 5% by weight of a hydrophilic substance;
   the support layer is a layer obtained by integrally molding a cushion layer and a resin film having a thermal dimensional change rate of 1.3 to 12.6%;
   the laminated polishing pad has a concavely warped form in the polishing layer side; and
   the laminated polishing pad has an average warp amount of 3 to 50 mm at the peripheral edge of the pad.

2. A method for manufacturing a laminated polishing pad, comprising the steps of:
   heating a polishing layer containing 0.5 to 5% by weight of a hydrophilic substance to 30 to 100° C.; and
   bonding the heated polishing layer to a support layer obtained by integrally molding a cushion layer and a resin film having a thermal dimensional change rate of 1.3 to 12.6% with an adhesive member interposed therebetween; wherein
   the laminated polishing pad has a concavely warped form in the polishing layer side, and
   the laminated polishing pad has an average warp amount of 3 to 50 mm at the peripheral edge of the pad.

3. A method for manufacturing a laminated polishing pad, comprising the steps of:
   laminating a hot-melt adhesive sheet on the surface of a cushion layer of a support layer obtained by integrally molding the cushion layer and a resin film having a thermal dimensional change rate of 1.3 to 12.6%;
   melting or softening a hot-melt adhesive by heating the laminated hot-melt adhesive sheet;
   laminating a polishing layer containing 0.5 to 5% by weight of a hydrophilic substance onto the melted or softened hot-melt adhesive, to thereby produce a laminated sheet;
   allowing the laminated sheet to pass through between rolls heated to 30 to 100° C. so that the pressure-bonding is performed; and
   curing the melted or softened hot-melt adhesive of the laminated sheet, wherein
   the laminated polishing pad has a concavely warped form in the polishing layer side, and
   the laminated polishing pad has an average warp amount of 3 to 50 mm at the peripheral edge of the pad.

4. A method for manufacturing a laminated polishing pad, comprising the steps of:
   applying a melted or softened hot-melt adhesive onto the surface of a cushion layer of a support layer obtained by integrally molding the cushion layer and a resin film having a thermal dimensional change rate of 1.3 to 12.6%;
   laminating a polishing layer containing 0.5 to 5% by weight of a hydrophilic substance onto the melted or softened hot-melt adhesive, to thereby produce a laminated sheet;

allowing the laminated sheet to pass through between rolls heated to 30 to 100° C. so that the pressure-bonding is performed; and curing the melted or softened hot-melt adhesive of the laminated sheet, wherein the laminated polishing pad has a concavely warped form in the polishing layer side, and the laminated polishing pad has an average warp amount of 3 to 50 mm at the peripheral edge of the pad.

5. The method for manufacturing a laminated polishing pad according to claim 3, wherein the hot-melt adhesive has a melting temperature of 130 to 170° C.

6. A method for manufacturing a semiconductor device, comprising the step of polishing the surface of a semiconductor wafer by using the laminated polishing pad according to claim 1.

7. The method for manufacturing a laminated polishing pad according to claim 4, wherein the hot-melt adhesive has a melting temperature of 130 to 170° C.

* * * * *